(12) United States Patent
Blatchford et al.

(10) Patent No.: US 9,123,562 B2
(45) Date of Patent: Sep. 1, 2015

(54) LAYOUT METHOD TO MINIMIZE CONTEXT EFFECTS AND DIE AREA

(71) Applicant: Texas Instruments Incorporated, Dallas, TX (US)

(72) Inventors: James Walter Blatchford, Richardson, TX (US); Thomas J. Aton, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 289 days.

(21) Appl. No.: 13/622,925

(22) Filed: Sep. 19, 2012

(65) Prior Publication Data
US 2013/0069081 A1 Mar. 21, 2013

Related U.S. Application Data

(60) Provisional application No. 61/536,213, filed on Sep. 19, 2011.

(51) Int. Cl.
| | | |
|---|---|---|
| *H01L 27/088* | (2006.01) | |
| *H01L 29/772* | (2006.01) | |
| *H01L 21/8234* | (2006.01) | |
| *H01L 27/02* | (2006.01) | |
| *H01L 29/78* | (2006.01) | |

(52) U.S. Cl.
CPC ...... *H01L 27/088* (2013.01); *H01L 21/823412* (2013.01); *H01L 21/823418* (2013.01); *H01L 21/823425* (2013.01); *H01L 21/823437* (2013.01); *H01L 27/0207* (2013.01); *H01L 29/78* (2013.01)

(58) Field of Classification Search
CPC .............. H01L 21/823412; H01L 27/088; H01L 21/823418; H01L 21/823437; H01L 27/0207; H01L 29/78; H01L 29/42372; G06F 17/5068
USPC .................. 257/206, 208, 401, E27.028, 392
IPC ...... H01L 27/0207, 27/088, 29/772, 21/823425
See application file for complete search history.

(56) References Cited

U.S. PATENT DOCUMENTS

| | | | | |
|---|---|---|---|---|
| 5,654,915 | A * | 8/1997 | Stolmeijer et al. | 365/156 |
| 6,184,588 | B1 * | 2/2001 | Kim et al. | 257/379 |
| 7,484,197 | B2 * | 1/2009 | Allen et al. | 716/122 |
| 8,552,509 | B2 * | 10/2013 | Becker et al. | 257/401 |
| 2002/0003270 | A1 * | 1/2002 | Makino | 257/390 |
| 2007/0218632 | A1 * | 9/2007 | Chung | 438/264 |
| 2010/0038684 | A1 * | 2/2010 | Parikh et al. | 257/255 |

* cited by examiner

*Primary Examiner* — Marcos D Pizarro
(74) *Attorney, Agent, or Firm* — Jacqueline J. Garner; Frank D. Cimino

(57) ABSTRACT

An integrated circuit with an active geometry with a wide active region and with a narrow active region with at least one jog where said wide active region transitions to said narrow active region and where a gate overlies said jog. A method of making an integrated circuit with an active geometry with a wide active region and with a narrow active region with at least one jog where said wide active region transitions to said narrow active region, where a gate overlies said jog and where a gate overlies the wide active region forming a wide transistor.

9 Claims, 6 Drawing Sheets

LAYOUT METHOD TO MINIMIZE CONTEXT EFFECTS AND DIE AREA

This application claims the benefit of and incorporates by reference U.S. Provisional Application 61/536,213, filed Sep. 19, 2011.

This invention relates to the field of integrated circuit fabrication methods. More particularly, this invention relates to the manufacture of semiconductor devices with different width transistors sharing a common active.

BACKGROUND

The active geometries of transistors may be joined together to eliminate the shallow trench isolation to reduce area and reduce cost in scaled-down technologies. For example two transistors 16 and 18, with gates 24 and 26, with active areas 20 and 22, having different transistor widths 21 and 23, respectively, as shown in FIG. 1 may be joined together as shown in FIGS. 2A and 2B. By joining the two active areas 20 and 22 together, the space 28 between the active areas 20 and 22 which is filled with shallow trench isolation (STI) field oxide may be eliminated significantly reducing the area of the two series transistors 16 and 18. Dummy gates 30 typically surround the transistor gates, 24 and 26, at a fixed pitch to improve patterning of the gates 24 and 26 and also to control the profile of the gates 24 and 26 during plasma etch.

In FIG. 2A two active area jogs, 32 and 34, are formed in the active areas 20 and 22 where the active area 20 with the larger width 21 transitions to the active area 22 with the lesser width 23.

In FIG. 2B one active area jog, 36 is formed in the active areas 20 and 22 where the wide active area 20 transitions to the narrow active area 22.

One problem with the transistor structure with joined active geometries is that the active overlap of the wide transistor is no longer uniform across the width of the wide transistor. In FIG. 1, active area overlaps 23 and 27 of the active area 20 adjacent to the gate 24 are of uniform width across the length of the transistor so series resistance due to the active area 20 is uniform. In FIG. 2B, the active area overlap 37 of the active area 20 adjacent to the gate 24 at the active area jog 36 is significantly less than that active area overlap 33 of the active area 22 adjacent to the gate 24 below the active area jog 36. The narrowness of the active area overlap 37 may also result in poor silicide formation additionally increasing series resistance and degrading the transistor 16 performance.

In scaled-down technologies, the close proximity of the active area jog 37 to the gate 24 of the transistor 16 has a pronounced impact on the width 21 of the transistor 16 due to photolithographic effects.

In FIG. 3 the active area jog 36 is placed midway between the gate 46 of the transistor 16 with the larger width 21 and the gate 48 of the transistor 18 with the lesser width 23. The active area overlap 44 of the active area 20 adjacent to the gate 46 at the active area jog 36 is about equal to active area spacing 42 between the active area jog 36 and the gate 48.

The percentage change in channel width of the transistor 16 as a function of the jog height 40 of the active area jog 36 is shown by plot 60 in FIG. 5. As is shown in the graph, when the jog height 40 exceeds about 20 nm, the percentage change in transistor width due to lithographic effects exceeds about 15%. Typically circuit simulators do not take this variation into account. Not taking this much variation into account may cause the circuit to fail.

To reduce the variation due to photolithographic effects and to reduce the difference in the active area overlap of a wide transistor gate at the active area jog and the active area overlap of the wide transistor gate below the active area jog, the active area jog may be placed midway between the wide and narrow transistor gates. Instead the active area jog may be moved closer to the narrow width transistor to increase the active area overlap of the wide width transistor gate as shown in FIG. 4. In FIG. 4, the active area overlap 52 of the active area 20 adjacent to the gate 56 of the transistor 16 with the larger width 21 is about double the active area spacing 50 between the active area jog 36 and the gate 58 of the transistor 18 with the lesser width 23.

The percentage change in channel width 53 of the transistor 16 with the larger width 21 as a function of the jog height of the active area jog 36 is shown by plot 62 in FIG. 5. The percentage change in channel width 53 of the transistor 16 is defined as the change in channel width 57 divided by the width 21 of the active area 20, times 100. As is shown in the graph, when the jog height exceeds about 20 nm, the change in transistor width due to lithographic effects exceeds about 11%. Typically circuit simulators do not take this variation into account. Not taking this much variation into account may cause the circuit to fail.

Scaled-down technologies often rely on strain engineering to boost the carrier mobility in the channel. Electron mobility in the channel of an NFET may be enhanced by applying tensile stress to the NFET channel and hole mobility in the channel of a PFET may be enhanced by applying compressive stress to the PFET channel.

For example, in the case of silicon substrates, p-channel field effect transistors (PFETS) are typically fabricated on substrates with a <100> crystallographic surface orientation. In <100> silicon the mobility of holes, which are the majority carriers in PFET can be increased by applying a compressive longitudinal stress to the channel. A compressive longitudinal stress is typically applied to the channel of a PFET by etching silicon from the source and drain regions and replacing it with epitaxially grown SiGe. Crystalline SiGe has a larger lattice constant than silicon and consequently causes deformation of the silicon matrix that, in turn, compresses the silicon in the channel region. Compression of the silicon lattice in the channel causes a separation of the light and heavy hole bands with a resulting enhancement of the low-field hole mobility. The increased hole mobility improves the PFET performance.

Because the lattice constant of single crystal SiGe is larger than the lattice constant of single crystal Si, the SiGe is under significant compressive stress during epitaxial crystal growth. FIG. 6 depicts an integrated circuit with substrate 70 and STI field oxide 84 in the substrate 70 and gates 76 on the substrate 70 and STI field oxide 84. The gates 76 have transistor sidewalls 74 on lateral surfaces. SiGe regions 78 are formed in the substrate adjacent to the transistor sidewalls 74 to form source and drain regions of transistors in the integrated circuit. To minimize stress, it is thermodynamically favorable to form facets 80 as is shown in FIG. 6. These facets 80 typically are formed at an interface of the SiGe regions 78 and the STI field oxide 84. These facets reduce the amount of SiGe next to the transistor channel region 82 and therefore reduce the stress applied to the channel of the transistor that lies beneath the transistor gate 76. Thus when facets 80 are formed the performance of the PFET is degraded. In addition, faceting may result in an increase in threading dislocations and an increase in diode leakage. The SiGe regions 78 may be formed next to the transistor sidewalls 74 as shown in FIG. 6 or may be formed next to the transistor gate 76 prior to formation of the transistor sidewalls 74. Forming SiGe in closer proximity to the channel region increases the compressive stress applied to the channel.

FIG. 7 depicts an integrated circuit with substrate 70 and STI field oxide 84 in the substrate 70 and gate 76 on the substrate 70. The gate 76 has transistor sidewalls 74 on lateral surfaces. SiGe regions 78 are formed in the substrate adjacent to the transistor sidewalls 74 to form source and drain regions of a transistor in the integrated circuit. As shown in FIG. 7, one method of eliminating the SiGe/STI dielectric interface where faceting typically occurs is to form a dummy gate 92 overlying the STI field oxide/substrate interface 90. This prevents SiGe from coming into contact with the STI field oxide where faceting typically occurs.

Transistor structures with active jogs such as are shown in FIGS. 2A and 2B are especially problematic for PFETS with epitaxial SiGe stress enhancement and for NFETS with epitaxial SiC stress enhancement. Faceting which reduces stress enhancement decreasing transistor performance and increased threading dislocations which cause excessive diode leakage are commonly formed during epitaxial growth of SiGe or SiC next to jogs. Consequently design rules which forbid active jogs when stress enhancement is to be used are commonly used. These design rules result in increased transistor area and increased cost.

SUMMARY

An integrated circuit with an active geometry with a wide active region and with a narrow active region with at least one jog where said wide active region transitions to said narrow active region and where a gate overlies said jog. A method of making an integrated circuit with an active geometry with a wide active region and with a narrow active region with at least one jog where said wide active region transitions to said narrow active region, where a gate overlies said jog and where a gate overlies the wide active region forming a wide transistor.

DETAILED DESCRIPTION OF EXAMPLE EMBODIMENTS

Embodiment transistor structures with different width transistors sharing a common active geometry are illustrated in FIGS. 8, 9, 10, and 11. Although only two transistors with different widths are used to illustrate the embodiment transistor structures additional transistors with different width actives are also included in the embodiment.

Figure 4:
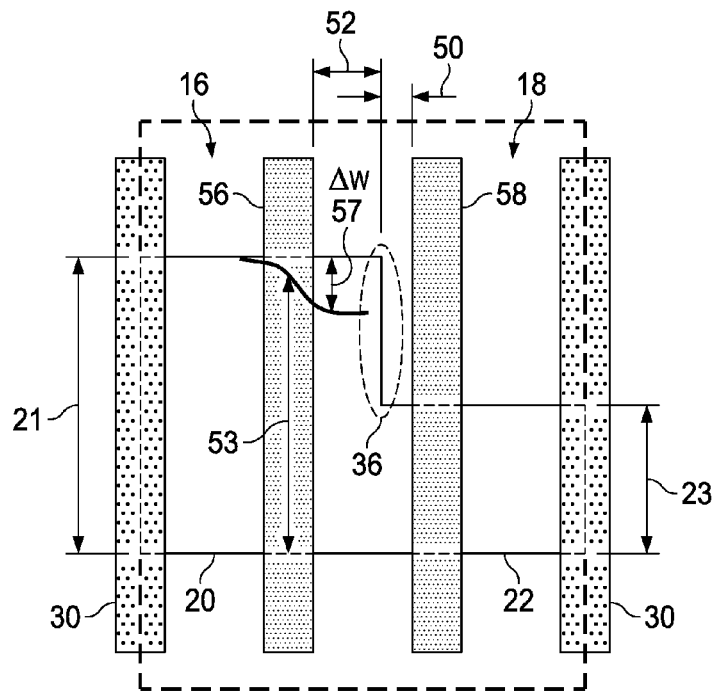
FIG. 4 (Prior art) is a top down view of a transistor structure with a wide transistor and a narrow transistor with connected active regions and with an active jog ⅔ the distance between the wide transistor and the narrow transistor.
Figure 5:
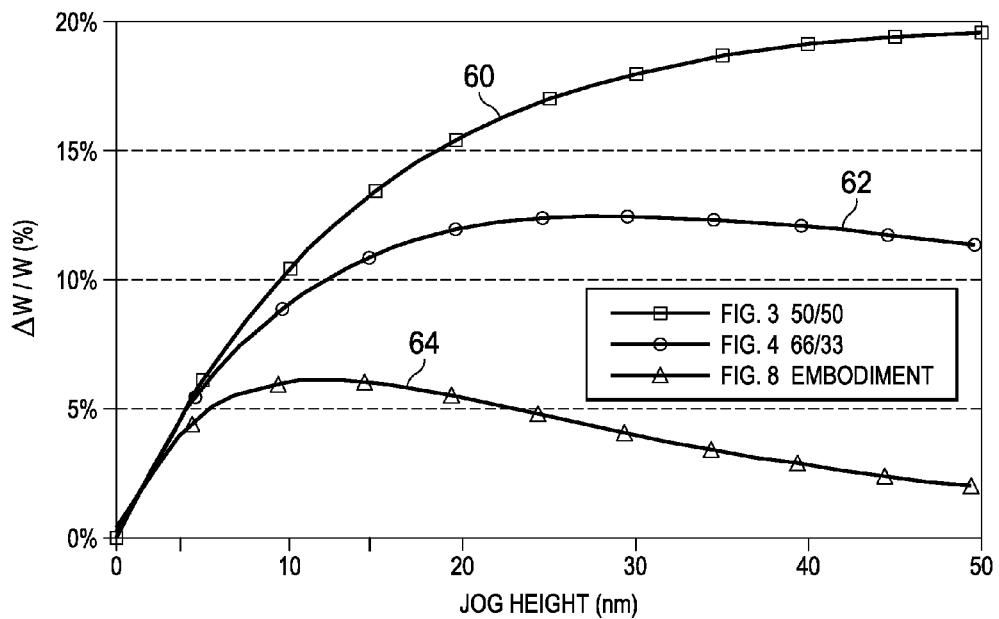
FIG. 5 is a graph of percentage change in effective wide transistor width versus jog height for conventional transistor structures and for an embodiment transistor structure.
Figure 6:
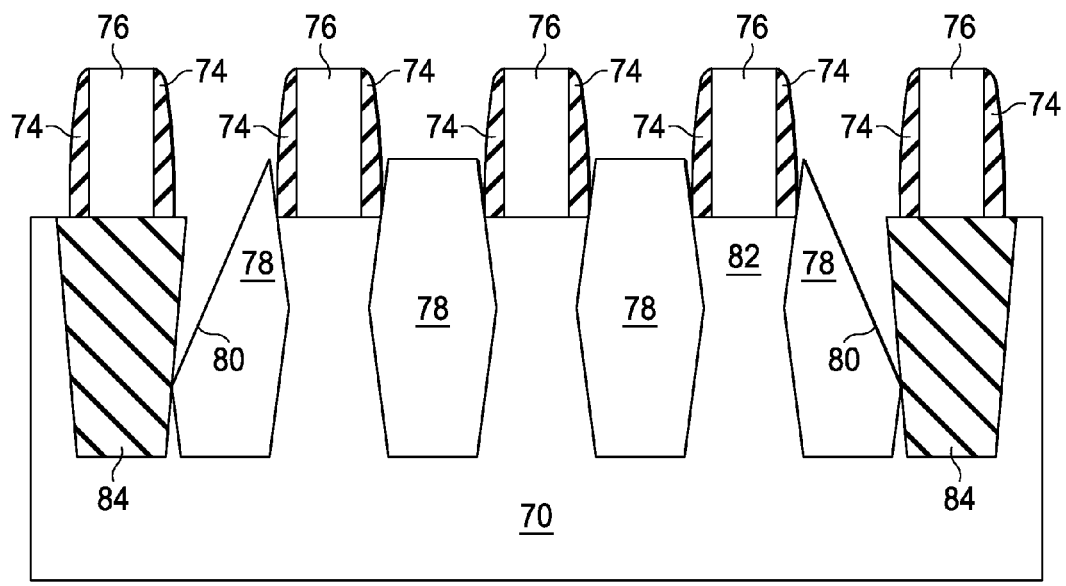
FIG. 6 (Prior Art) is a cross sectional view of PMOS transistors with epitaxial SiGe source and drains and with a SiGe/shallow trench dielectric interface.
Figure 7:
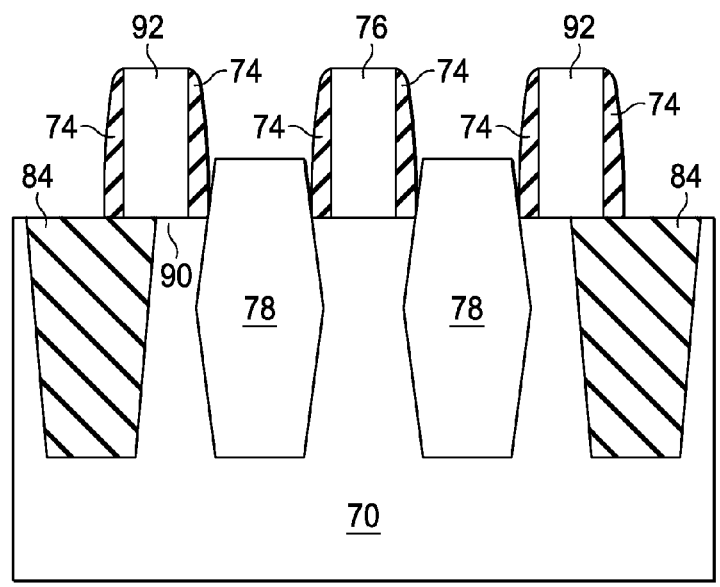
FIG. 7 (Prior Art) is a cross sectional view of PMOS transistors with epitaxial SiGe source and drains with no SiGe/shallow trench dielectric interface.
Figure 8:
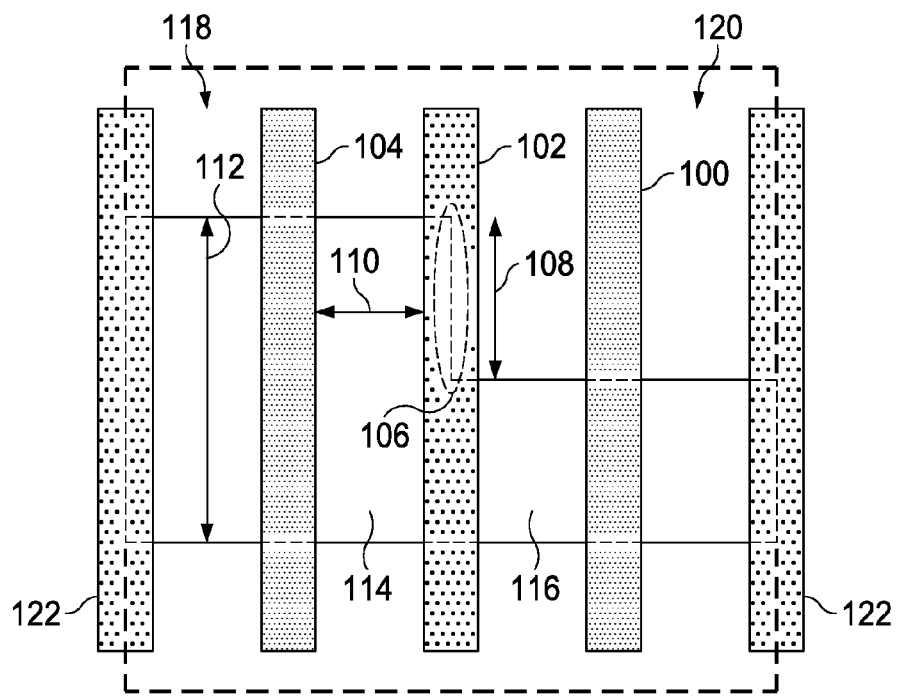
FIGS. 8, 9, 10, and 11 are top down views of embodiment transistor structures with a wide transistor and a narrow transistor circuit formed according to principles of the invention.

FIG. 8 depicts an integrated circuit with a transistor structure having a wide transistor 118 including a gate 104 over an active area 114 with a width 112, and a narrow transistor 120 including a gate 100 over an active area 116 which has a width less than the width 112. There is an active area jog 106 with jog height 108 where the active area 114 meets the active area 116. Dummy gates 122 surround the gates 100 and 104, and a dummy gate 102 is disposed between the gates 100 and 104. The dummy gates 122 and 102, and the gates 100 and 104 are formed on a constant pitch as shown in FIG. 8. In FIG. 8 the active area jog 106 is formed under the dummy gate 102. Unlike the conventional transistor structure shown in FIGS. 3 and 4, the active area overlap 110 adjacent to the transistor gate 104 has minimal impact on the width 112 of the active area 114 under the gate 104 due to photolithography. Plot 64 in FIG. 5 shows the percentage width variation of the width 112 of the of the active area 114 under the gate 104 as a function of the jog height 108. The variation of the width 112 vs jog height 108 for the embodiment transistor structure in FIG. 8 is below 6%. When the jog height 108 exceeds about 20 nm variation is below about 5%. Typically circuit simulators do not take this variation into account. The variation of the embodiment transistor structure is less than would be an issue for most conventional circuit simulators.

Figure 1:
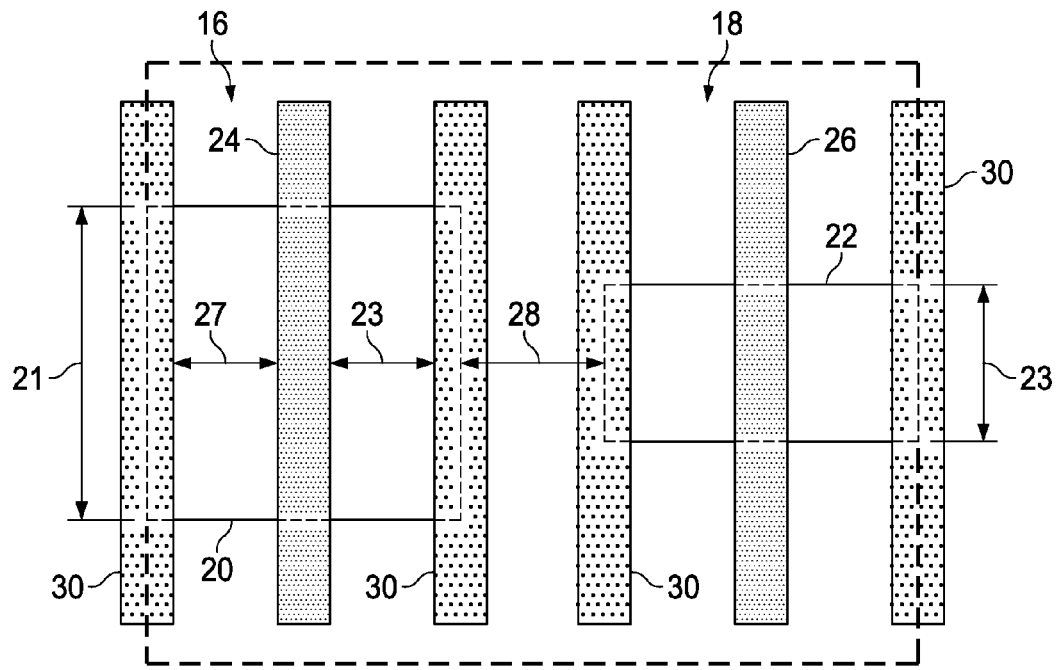
FIG. 1 (Prior art) shows two different width transistors whose active geometries are separated by shallow trench isolation FIGS. 2A and 2B (Prior art) are examples of different width transistors that share a common active geometry.
Figure 2A:
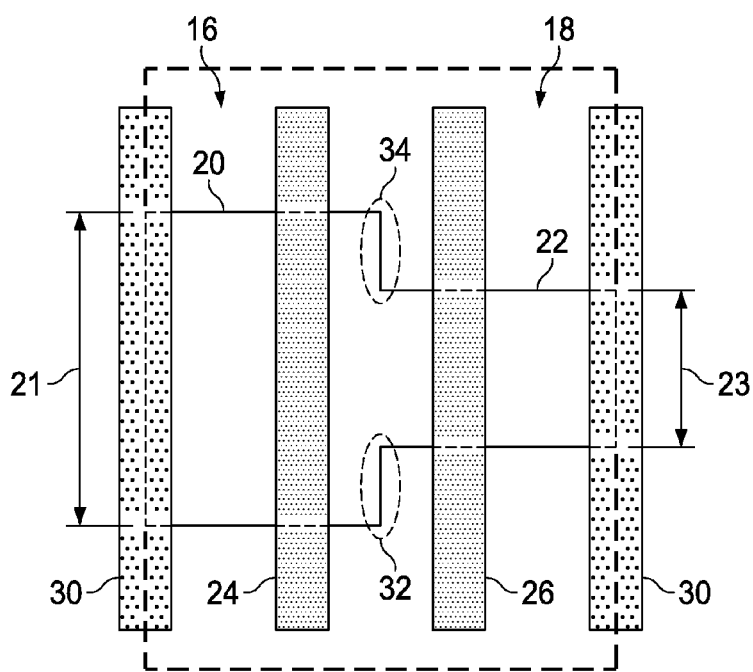
Figure 2B:
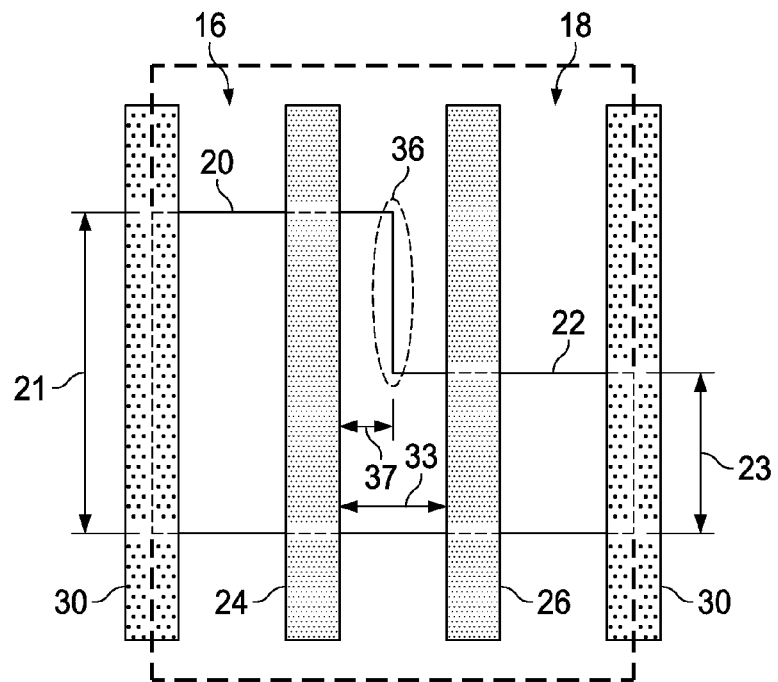
Figure 3:
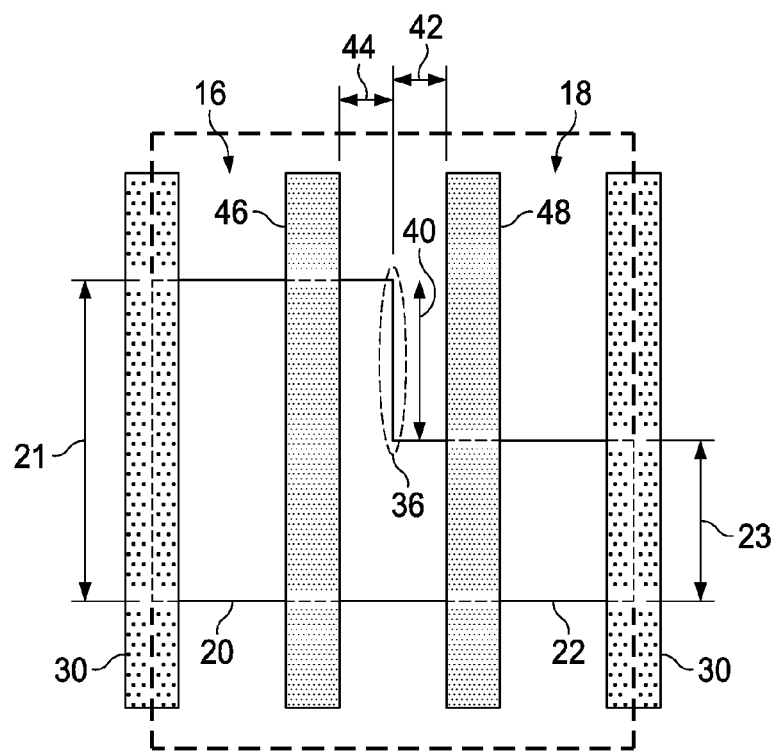
FIG. 3 (Prior art) is a top down view of a transistor structure with a wide transistor and a narrow transistor with connected active regions and with an active jog midway between the wide transistor and the narrow transistor.

Another advantage of the embodiment transistor structure in FIG. 8 is that unlike the active area overlap adjacent to a wide transistor gate in conventional transistor structures shown in FIG. 3 and FIG. 4 which is nonuniform above and below the active area jog, the active area overlap 110 adjacent to the gate 104 has constant width 112 across the wide transistor 118. This ensures a constant series resistance across the wide transistor 118 and also facilitates formation of a uniform silicide across the entire active area width 112 of the wide transistor 118.

Yet another advantage of the embodiment transistor structure in FIG. 8 is that there are no active area jogs in source or drain regions where epitaxial SiGe or SiC may be grown to enhance carrier mobility and transistor performance. With no active area jogs in these active regions epitaxial SiGe or SiC may be grown without producing faceting and without producing excessive diode leakage due to threading dislocations.

The dummy gate 102 which overlies the active area jog 106 in FIG. 8 may be connected to any appropriate fixed voltage to isolate the narrow transistor 120 from the wide transistor 118. Alternatively, the dummy gate 102 may be left unconnected (floating) or may be attached to a voltage appropriate to turn on a channel under the dummy gate 102 so that the voltage of the active are 114 and active area 116 assume approximately the same voltage. Active areas 114 and 116 may also be shorted together using contacts and a layer of interconnect to have the same potential.

Figure 9:
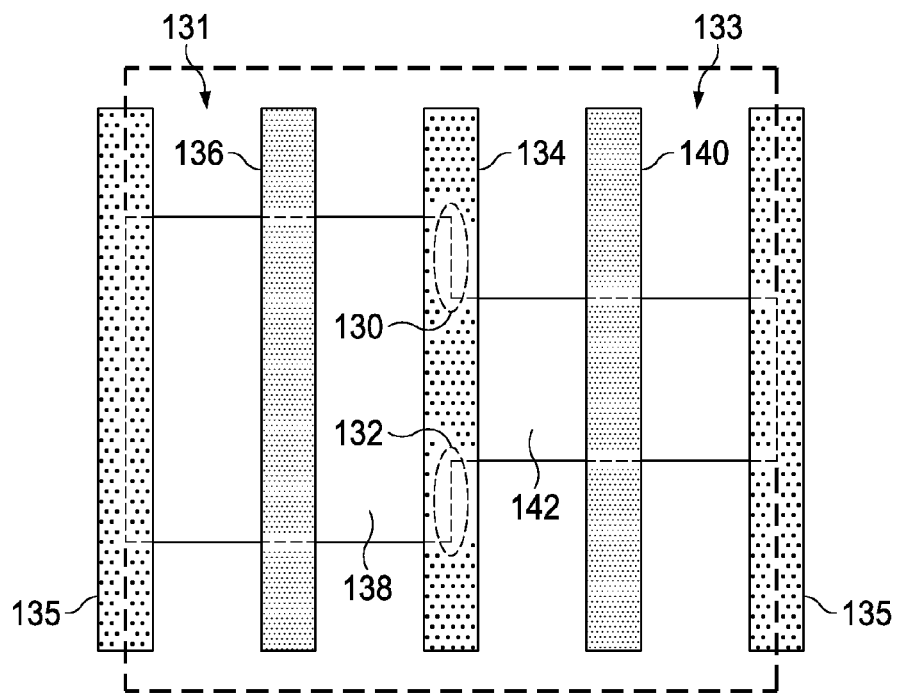

Another embodiment transistor structure is illustrated in FIG. 9. A transistor structure has a wide transistor 131 including a gate 136 over an active area 138, and a narrow transistor 133 including a gate 140 over an active area 142. There is a first active area jog 130 and a second active area jog 132 where the active area 138 meets the active area 142. Dummy gates 135 surround the gates 136 and 140, and a dummy gate 134 is disposed between the gates 136 and 140. The dummy gates 135 and 134, and the gates 136 and 140 are formed on a constant pitch as shown in FIG. 9. This embodiment is similar to the embodiment in FIG. 8 but with the two active area jogs 130 and 132 under the dummy gate 134. As with the embodiment transistor structure in FIG. 8 this embodiment has the advantages of significantly reduced dependence of the channel width of wide transistor 131 versus a height of the first active area jog 130 and a height of the second active area jog 132, constant series resistance and uniform silicide growth because active area 138 has a constant width across wide transistor 131, and the ability to epitaxially grow SiGe or SiC in the active area 138 without faceting because of the lack of active jogs.

As with the embodiment transistor structure in FIG. 8, the dummy gate 134 which covers the active area jogs 130 and 132 may be connected to any appropriate fixed voltage to isolate narrow transistor 133 from wide transistor 131. Alternatively, the dummy gate 134 may be left unconnected (floating) or may be attached to a voltage appropriate to turn on a channel under the dummy gate 134 so that the voltage of the active area 138 and active area 142 may assume approximately the same voltage. Active areas 138 and 140 may also be shorted together using contacts and a layer of interconnect so they have the same potential.

Figure 10:
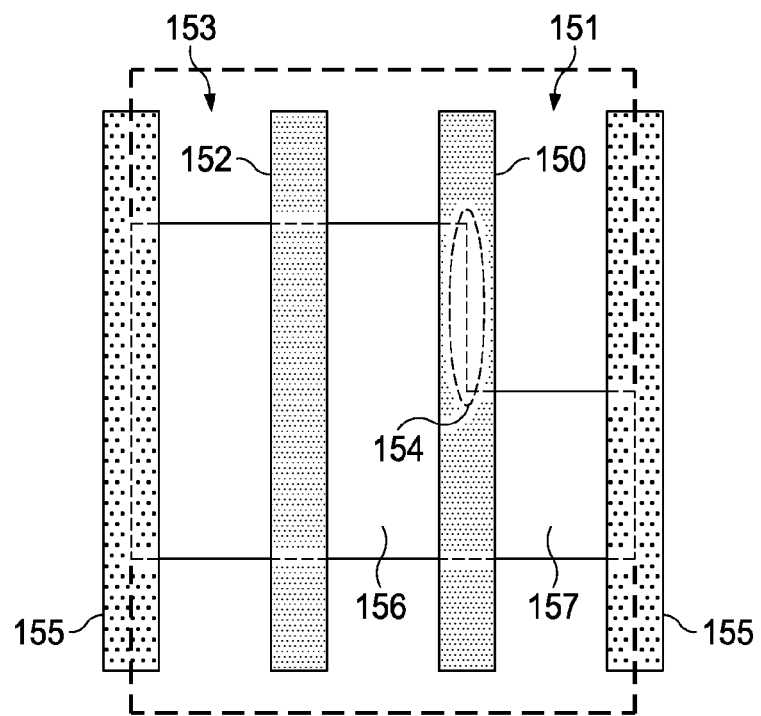

FIG. 10 depicts a transistor structure having a wide transistor 153 including a gate 152 over an active area 156, and a narrow transistor 151 including a gate 150 over an active area 157 which is more narrow than the active area 156. There is an active area jog 154 where the active area 156 meets the active area 157. Dummy gates 155 surround the gates 150 and 152. The dummy gates 155 and the gates 150 and 152 are formed on a constant pitch as shown in FIG. 10. In the embodiment transistor structure shown in FIG. 10 the gate 150 is located over the active area jog 154 and may be treated as an ordinary, driven, connected transistor gate. In this embodiment the wide transistor 153 is in series with the narrow transistor 151 formed by the gate 150 overlying the active area jog 154. The drive strength of the transistor 151 with the active jog 154 for electrical simulation and other IC construction purposes may be determined experimentally or by other appropriate means known to those skilled in the art. Additional variability in drive strength due to misalignment between gate 150 and the active area 157 with the active area jog 154 may be included in the electrical simulation model.

Figure 11:
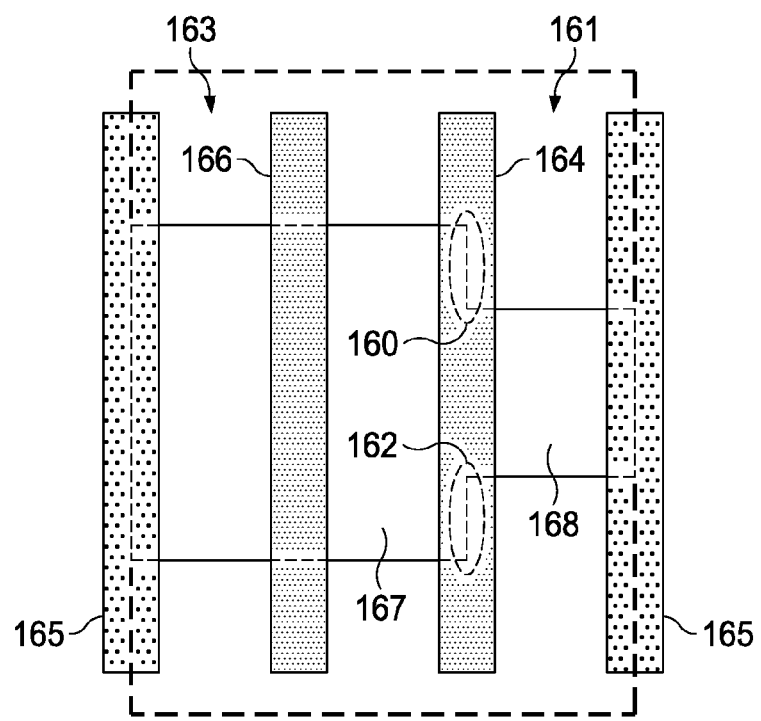

FIG. 11 depicts a transistor structure having a wide transistor 163 including a gate 166 over an active area 167, and a narrow transistor 161 including a gate 164 over an active area 168 which is more narrow than the active area 167. There is an active area jog 160 and an active area jog 162 where the active area 167 meets the active area 168. Dummy gates 165 surround the gates 164 and 166. The dummy gates 165 and the gates 164 and 166 are formed on a constant pitch as shown in FIG. 11. The embodiment transistor structure shown in FIG. 11 is similar to the embodiment transistor structure in FIG. 10 with the two active jogs 160 and 162 instead of one. As with the embodiment structure in FIG. 10, the gate 164 over the active area jogs 160 and 162 may be treated as an ordinary, driven, connected transistor gate. In this embodiment the wide transistor 163 is in series with the narrow transistor 161 formed by the gate 164 overlying the active area jogs 160 and 162. The drive strength of the transistor 161 with the active area jogs 160 and 162 may be determined for electrical simulation and other IC construction purposes experimentally or by other appropriate means known to those skilled in the art. Additional variability in drive strength due to misalignment between gate 164 and the active area jogs 160 and 162 may be included in the electrical simulation model.

Those skilled in the art to which this invention relates will appreciate that many other embodiments and variations are possible within the scope of the claimed invention.

What is claimed is:

1. An integrated circuit, comprising:
   a wide transistor including a gate over an active area;
   a narrow transistor including a gate over an active area, wherein a width of said active area of said narrow transistor is less than a width of said active area of said wide transistor, wherein said active area of said wide transistor meets said active area of said narrow transistor, and wherein there is an active area jog where said active area of said wide transistor meets said active area of said narrow transistor; and
   a dummy gate disposed between said gate of said wide transistor and said gate of said narrow transistor and located over said active area jog, wherein said gate of said wide transistor, said dummy gate and said gate of said narrow transistor are disposed on a constant pitch.

2. The integrated circuit of claim 1 where said dummy gate is connected to a voltage appropriate to electrically isolate said active area of said wide transistor from said active area of said narrow transistor.

3. The integrated circuit of claim 1 where said dummy gate is connected to a voltage appropriate to electrically couple said active area of said wide transistor with said active area of said narrow transistor.

4. The integrated circuit of claim 1 where said dummy gate is floating.

5. The integrated circuit of claim 1 where said wide transistor includes epitaxial SiGe in said active area of said wide transistor and said narrow transistor includes epitaxial SiGe in said active area of said narrow transistor.

6. The integrated circuit of claim 1 where said wide transistor includes epitaxial SiC in said active area of said wide transistor and said narrow transistor includes epitaxial SiC in said active area of said narrow transistor.

7. The integrated circuit of claim 1, wherein said active area jog is a first active area jog and there is a second active area jog where said active area of said wide transistor meets said active area of said narrow transistor, and said dummy gate is located over said second active area jog.

8. An integrated circuit, comprising:
   a wide transistor including a gate over an active area; and
   a narrow transistor including a gate over an active area;
   wherein:
      a width of said active area of said narrow transistor is less than a width of said active area of said wide transistor;
      said active area of said wide transistor meets said active area of said narrow transistor;
      there is an active area jog where said active area of said wide transistor meets said active area of said narrow transistor; and
      said gate of said narrow transistor is located over said active area jog.

9. The integrated circuit of claim 8, wherein said active area jog is a first active area jog and there is a second active area jog where said active area of said wide transistor meets said active area of said narrow transistor, and said gate of said narrow transistor is located over said second active area jog.

* * * * *